United States Patent
Deane et al.

(10) Patent No.: US 6,686,229 B2
(45) Date of Patent: Feb. 3, 2004

(54) THIN FILM TRANSISTORS AND METHOD OF MANUFACTURE

(75) Inventors: Steven C. Deane, Redhill (GB); Catherine J. Curling, Horley (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 20 days.

(21) Appl. No.: 10/067,377

(22) Filed: Feb. 5, 2002

(65) Prior Publication Data

US 2003/0148560 A9 Aug. 7, 2003

(30) Foreign Application Priority Data

Mar. 2, 2001 (GB) ............................................. 0105145

(51) Int. Cl.[7] .......................... H01L 21/00; H01L 29/15
(52) U.S. Cl. ......................................... 438/151; 257/72
(58) Field of Search ................................. 438/149–152, 438/142, 197–198, 800; 257/67, 72, 213, 798

(56) References Cited

U.S. PATENT DOCUMENTS

| | | | |
|---|---|---|---|
| 5,127,330 A | 7/1992 | Okazaki et al. | 101/450.1 |
| 5,311,041 A | 5/1994 | Tominaga et al. | 257/66 |
| 5,989,945 A | 11/1999 | Yudasaka et al. | 438/149 |
| 6,080,606 A | 6/2000 | Gleskova et al. | 438/151 |

FOREIGN PATENT DOCUMENTS

| | | | |
|---|---|---|---|
| EP | 0471628 | 2/1992 | ......... H01L/21/033 |
| EP | 0505227 | 9/1992 | ......... H01L/21/84 |
| JP | 60-133758 | 7/1985 | ......... H01L/29/78 |
| JP | 1-223429 A | 9/1989 | ......... G02F/1/133 |
| JP | 4-309927 A | 11/1992 | ......... G02F/1/136 |
| JP | 07244298 A | 9/1995 | ......... G02F/1/136 |
| WO | WO 99/50889 | 10/1999 | |

OTHER PUBLICATIONS

Patent Abstracts of Japan, Uno Mitsuhiro, "Manufacture Of Semiconductor Device," Publication Number 02139972, May 29, 1990, Application Number 63293834, Nov. 21, 1988.

"A new fabrication technology for very–large–area TFT–LCDs", by Eiji Kaneko, Displays, vol. 14., No. 2, 1993, pp. 125–130.

"A new patterning Process Concept for large–area Transistor Circuit Fabrication Without Using an Optical Mask Aligner", by Y. Mikami et al., IEEE Transactions on Electron Devices, vol. 41, No. 3, Mar. 1994.

"Very Simple a–Si TFT Fabrication Process for LCD–TV Application", by M. Le Contellec et al, J. Non–Cryst. Solids, vol. 97 & 98 (1987) pp. 297–300.

*Primary Examiner*—Craig A. Thompson

(57) ABSTRACT

A method of manufacturing thin film transistors includes the steps of depositing and patterning a plurality of layers (3,13,15,23) to define the thin film transistors, wherein one of the plurality of layers (23) is patterned using a higher definition process and others (3,13,15) of the plurality of layers are patterned using a lower definition process. In particular, a metallisation layer (23) defining the source and drain of the thin film transistors may be patterned using the high definition process and the other layers patterned by the low definition process. The high definition process may be photolithography and the low definition process may be printing.

17 Claims, 4 Drawing Sheets

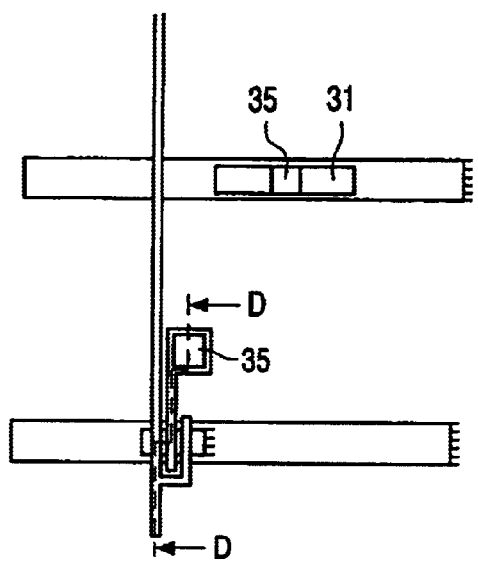
FIG. 1d (i)
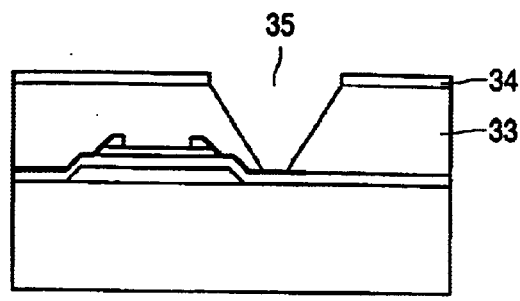
FIG. 1d (ii)
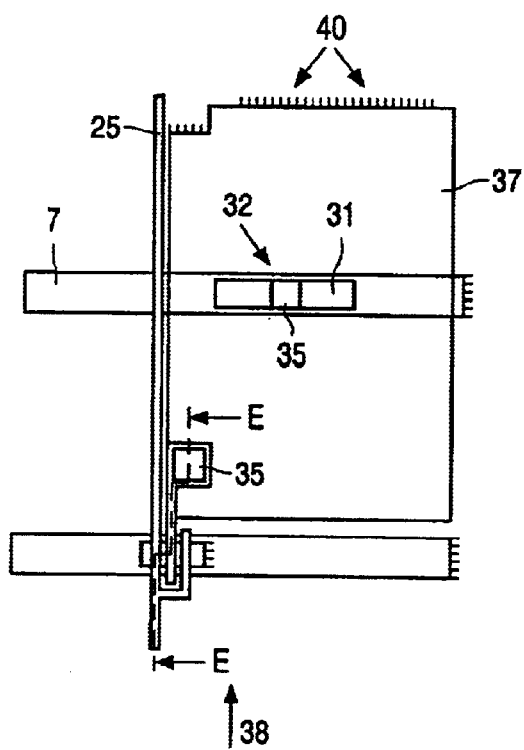
FIG. 1e (i)
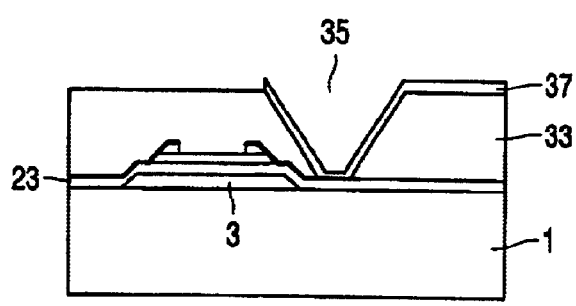
FIG. 1e (ii)

THIN FILM TRANSISTORS AND METHOD OF MANUFACTURE

The invention relates to thin film transistors and in particular to a method of manufacture of a device including a number of thin film transistors.

Thin film transistors (TFTs) are widely used in a number of applications. A particularly important application for thin film transistor technology is in the field of active matrix liquid crystal displays. However, this is not the only application; another example is in the field of X-ray detectors which may include a photodiode array in which each photodiode is connected to a corresponding thin film switching transistor.

A typical TFT on an active plate of an active matrix liquid crystal display is illustrated in FIG. 6. A gate 51 extends laterally from a row electrode 53, a semiconductor region 55 is provided on the gate extension and source 57 and drain 59 metallisations are provided over the semiconductor region, one of the source and drain being connected to a column electrode 61 and the other to a pixel electrode 65, generally made of transparent indium tin oxide (ITO). The source, gate and drain and the semiconductor region define a thin film transistor 63.

The current state of the art process for making arrays of thin film transistors, for example for making active matrix liquid crystal displays (AMLCDs), involves depositing material in sheet form and then using photolithography and etching to pattern the material. Typically, five mask steps are used in a TFT design, although some processes have been proposed with four mask steps. The need to deposit material layers, define photoresist on each layer and then etch or develop away typically 95% of each material layer limits the possible cost savings. Moreover, the high performance patterning tools used have high capital cost, limited throughput and use large quantities of costly photoresist and developer.

As an alternative, it has been proposed to directly print resist in the desired pattern, instead of coating, exposing, developing and baking photoresist in the conventional photolithography process. This would save costs by increasing throughput, reducing capital costs and lowering materials costs as compared to a conventional photolithography process. A more radical option proposed is to directly print the material required, or a precursor of that material, thus also eliminating the blanket deposition, resist stripping and etching processes.

Unfortunately, printing processes have poor resolution and alignment accuracy compared with conventional photolithography. Typical printing resolutions are of order 10 $\mu$m and alignment accuracy is of order 10 $\mu$m for offset printing techniques. These compare unfavourably to the resolution of 4 $\mu$m and alignment accuracy of 1.5 $\mu$m achieved using conventional photolithography for AMLCDs. If conventional thin film transistor (TFT) designs on the active plates of conventional AMLCDs are scaled up to printing design rules, then the resulting TFTs would have too high a parasitic capacitance to provide an adequate performance.

A second problem is that printing processes such as gravure-offset printing, and other forms of printing, tend to leave hairs or tails of material from the trailing edge of features. These can lead to short circuits in the TFTs and other faults in AMLCDs. With conventional AMLCD TFT and pixel designs, the TFT is placed in the corner of each pixel, with the gate defined by a protrusion from a row line. If a printing technology such as gravure-offset is used, the hairs could lead to undesirable features such as variable capacitive coupling from the gate to the pixel, leading to display effects such as flicker.

A partial solution to the problems of printing TFTs is proposed by M. Ie Contellec et al, J. Non-Cryst. Solids, Vol 97&98 (1987) pages 297 to 300, "Very Simple a-Si TFT Fabrication Process for LCD-TV Application". They propose a TFT design and an associated process in which the design is tolerant to misalignment between the two mask layers. However, the process proposed has a number of disadvantages. The column electrodes are made of Indium Tin Oxide (ITO) which has a high resistivity which limits the display size. The two-mask top gated structure proposed results in a high parasitic capacitance loading on the row electrode, which also limits display size. The semiconductor layer is exposed to the light in a transmissive AMLCD, which would lead to unacceptable leakage current unless an additional light shield layer is used.

Instead of the two-mask top-gated structure, it would be preferred to use a bottom gated structure, which has become the industry standard. The basic layout of the design of le Contellec et al could be translated into a bottom gated process with a higher mask count. However, given the coarser resolutions of printing technologies, the resulting TFTs would have too high a parasitic capacitance to provide a good performance in an AMLCD.

A number of other suggestions for fabricating devices using printing for patterning have also been published.

For example, Eiji Kaneko describes in Displays, Volume 14, Number 2, (1993) "A new fabrication technology for very-large-area TFT-LCDs", an all-printed process for manufacturing active matrix displays. Likewise, Y. Mikami et al also describe, in IEEE Transactions On Electron Devices, vol. 41, no. 3, March 1994, "A New Patterning Process Concept for Large-Area Transistor Circuit Fabrication Without Using an Optical Mask Aligner", an all-printed TFT LCD.

However, these publications do not disclose a solution to the problems of excessive parasitic capacitance or of the possible short circuits from "tails" of material extending from printed regions.

Accordingly, there remains a need for an improved method of fabricating thin film transistors, and devices including thin film transistors such as AMLCDs.

According to a first aspect of the invention there is provided a method of manufacturing a plate having an array of thin film transistors including the steps of: forming and patterning by a lower definition process a layer defining row conductors extending across a substrate, forming and patterning by a lower definition process semiconductor regions to form the channel regions of thin film transistors, the semiconductor regions being vertically aligned with regions of the row conductors which regions form the gates of the thin film transistors; forming a gate insulation layer between the layer defining row conductors and the semiconductor regions; and depositing and patterning the sources and drains of the thin film transistors using a higher definition process.

The method forms the plate in such a way that only one layer, the layer defining the source and drain, needs to be accurately defined by a high definition (resolution) process. This layer defines the channel length. Other layers can be patterned by a lower definition process, e.g. printing. In this way, the method can manufacture plates more economically.

In embodiments of the invention a number of different processes may be used for the lower definition process and for the higher definition process, depending on the resolution required. As will be appreciated by the skilled person, photolithography is a particularly useful high definition process. Projection photolithography may be used, for high definition. As an alternative, photolithography may be carried out using a proximity aligner; this is sufficient to define a channel length of around 7 µm with sufficient accuracy.

The process with a lower definition may be a low resolution photolithography process, such as with a proximity aligner, or alternatively a printing process such as gravure-offset printing.

Where printing is used to pattern a layer the printing process may directly print the layer. This avoids material wastage.

The row conductor may have a substantially uniform width across the region of the substrate in which thin film transistors are formed. The semiconductor region may be substantially in the form of rectangles extending with the long axes substantially parallel to the rows. With this relatively simple form the semiconductor region may be printed without trailing hairs having a negative effect.

The method may be applied to the manufacture of an active plate for a active matrix liquid crystal display (AMLCD). The method may accordingly additionally include forming and patterning pixel electrodes using a lower resolution process.

The source electrode may be formed on one side of the drain electrode and a finger electrode may extend around the drain electrode to the other side of the drain electrode. This effectively provides a pair of source electrodes arranged on either side of the drain electrode, which improves alignment tolerance. A subsidiary benefit is that the arrangement can deliver the desired effective aspect ratio.

The printing may be carried out using any suitable printing process, such as gravure-offset printing, although alternative printing techniques may also be used.

The row conductors may be printed in a row direction and the semiconductor regions may be printed in the same row direction.

The pixel electrodes may be printed in a direction substantially perpendicular to the row direction. The structure may have gaps between pixel electrodes and the row conductors longer than the length of trailing tails or hairs from the printing process, which may be of order 10 µm long.

In these ways, the effects of any tails or hairs trailing from the printed regions may be minimized.

The method may be used to fabricate bottom gated TFTs in which the row electrode acting as gate is formed under the semiconductor acting as the channel of the TFTs. The higher definition process may then be used to form metallisations for source and drain over the semiconductor layer.

The semiconductor region may be a stack consisting of a lower layer of lower doped semiconductor and an upper layer of higher doped semiconductor, and the method may include the step of etching back the upper layer using the source and drain metallisation as a mask.

The invention is not limited to the specific layers and patterning steps listed above. Accordingly, a second aspect of the invention provides a method of manufacturing a plate having an array of thin film transistors, including depositing and patterning a plurality of layers to define the thin film transistors, wherein one of the plurality of layers is patterned using a higher definition process and others of the plurality of layers are patterned using a lower definition process.

In general, it is more expensive to pattern layers with a higher resolution than a lower resolution. Accordingly, by patterning only one layer of the thin film transistor with a higher resolution the expense of making a device may be minimized. The higher definition layer may be patterned using photolithography, and the lower definition layer by printing.

One of the layers patterned with a lower definition process may be a row electrode layer defining a plurality of row electrodes extending across the array of thin film transistors with substantially constant width, wherein the thin film transistors are formed vertically aligned with the row electrodes, and wherein the layer defining the source and drain of the thin film transistors is patterned with the higher definition process.

The invention is particularly suitable for manufacturing an active plate of a liquid crystal display, including the steps of forming and patterning by a lower definition process a layer defining row conductors extending across a substrate, forming a gate insulation layer over regions of the row conductors; and forming and patterning by a lower definition process semiconductor regions over the gate insulation layer to form the channel regions of thin film transistors so that the regions of the row conductors under the semiconductor regions act as gates; depositing and patterning a metallisation layer with a higher definition process to define the sources and drains of the thin film transistors, and depositing and patterning pixel electrodes with a lower definition process.

The invention also relates to a method of manufacturing an active matrix LCD display including manufacturing an active plate using a method as described above; providing a passive plate; and sandwiching liquid crystal between the active and passive plates.

In another aspect, the invention relates to an active plate of a liquid crystal display manufactured using the method described above. The active plate may comprise an active plate for an active matrix liquid crystal device, comprising: a substrate; row conductors extending across the substrate; semiconductor regions extending over part of the row conductors forming the channel regions of thin film transistors; a metallisation layer defining the source and drain of the thin film transistors and column conductors connected to one of the source and drain; and pixel electrodes connected to the other of the source and drain of the thin film transistors.

The invention also relates to an active matrix liquid crystal display including such an active plate, a passive plate and in which liquid crystal is sandwiched between active and passive plates.

Specific embodiments of the invention will now be described, purely by way of example, with reference to the accompanying drawings, in which:

FIGS. 1(a)(i) to 1(e)(i) show the manufacturing steps of an active plate of an AMLCD according to the invention in top view, and FIGS. 1(a)(ii) to 1(e)(ii) show cross-sectional side views of FIGS. (1)(a)(i) to (1)(e)(i) along lines A—A, B—B, C—C, D—D and E—E, respectively;

Figure 4A:
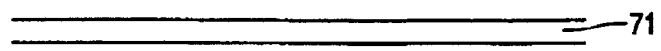
Figure 4B:
Figure 4C:
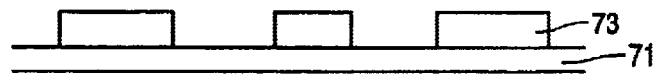
Figure 5:
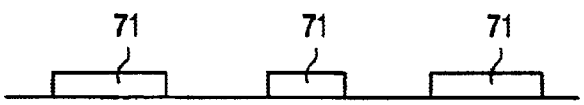

FIGS. 4(a) to 4(c) illustrate an alternative manufacturing method according to the invention; and FIG. 5 illustrates a prior art AMLCD structure.

It will be appreciated that the Figures are merely schematic and have not been drawn to scale. The same reference numbers have been used throughout the Figures to denote the same or similar parts.

Figure 1A:
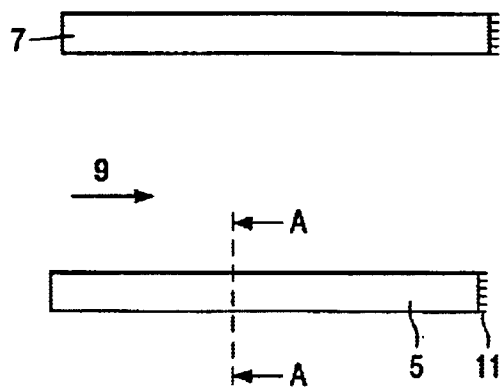
Figure 1B:
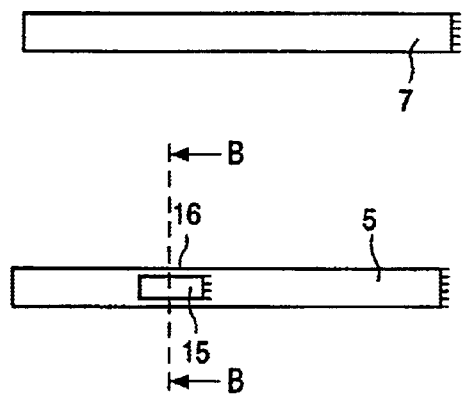
Figure 1C:
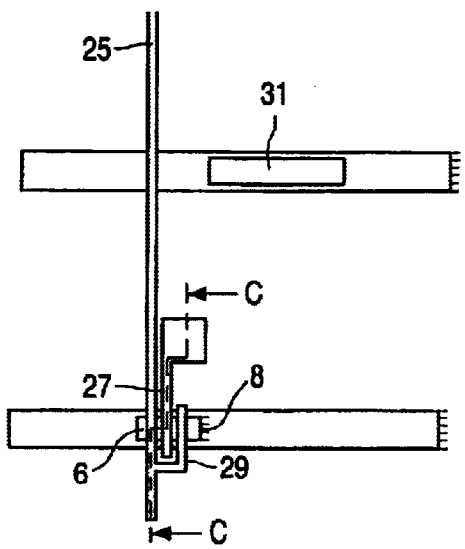
Figure 2:
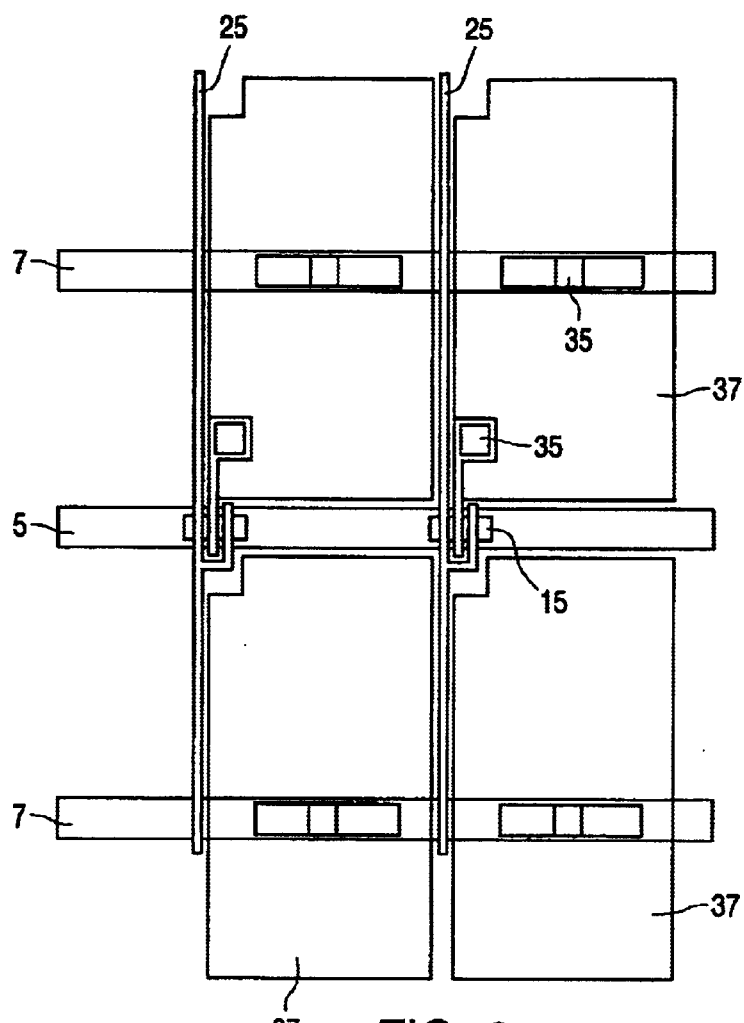
FIG. 2 shows a top view of an active plate design according to the invention.

Referring to FIGS. 1 and 2, an exemplary method of manufacturing a thin-film device according to the invention will now be described. In the example, the device is an active plate of an active matrix liquid crystal display.

Firstly, as shown in FIGS. 1(a)(i) and (ii) a substrate 1 is provided. The substrate is made of a transparent material, such as glass, with a substantially flat upper surface 2.

Figure 3:
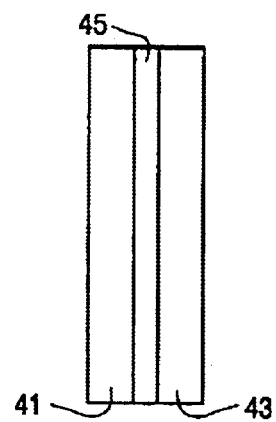
FIG. 3 shows an AMLCD made in accordance with the invention.

A first metallisation layer 3 is printed on the surface 2 of the substrate 1. The metallisation layer 3 defines a plurality of row electrodes 5 that extend across the substrate, and a plurality of storage capacitor lines 7 that likewise extend across the substrate parallel to the row electrodes. For clarity, only one row electrode 5 and one storage capacitor line 7 are shown in FIGS. 1(a) to (e) but it will be appreciated that in fact a number of row electrodes 5 and storage capacitor lines 7 are provided, as illustrated in FIG. 3 which shows a completed device.

The first metallisation layer 3 is printed in a single offset printing operation that prints across the substrate in a row direction 9 parallel to the row electrodes 5. Both the row electrode 5 and capacitor line 7 are of substantially constant width in the area of the array used for the display. Any tails 11 which occur at the end of the row electrode 5 and capacitor line 7 occur outside the area of the display and accordingly have little effect.

A gate dielectric layer 13 of silicon nitride is then formed over the whole of the substrate (FIGS. 1(b)(i) and (ii)) Next, semiconductor islands 15 are formed on the substrate. These are formed by depositing a layer of intrinsic amorphous silicon 17 (i a-Si:H) and then a layer of doped amorphous silicon 19 (n+ a-Si:H). Each layer is printed using a mask of the same form. The semiconductor islands are arranged over the row electrodes and are rectangular in form, with the long sides of the rectangles parallel to the row electrodes 5. The printing is carried out in the row direction 9. The regions 16 of the row electrodes 5 under the semiconductor islands act as gate electrodes.

The next step is to provide a further metallisation layer 23 (FIGS. 1(c)(i) and (ii)). This is deposited over the whole substrate and then patterned using conventional photolithography. The metallisation layer forms column electrodes 25, which extend across the substrate in a direction perpendicular to the row electrodes 5, drain electrodes 27, and fingers 29 which extend from the column electrode 25, around the respective drain electrode, and back across the respective semiconductor island 15. The drain electrodes 27, fingers 29 and column electrodes 25 in the region of the semiconductor islands 15 extend across the islands perpendicularly to the row direction 9. The column electrode 25 and finger 29 form interconnected source electrodes, either side of drain electrode 27.

As a result of using a printing process to form the semiconductor island 15, the location of its trailing edge 8 may not be accurately controllable or defined. In the absence of the finger 29, the gate-drain capacitance of the TFT would not therefore be well defined. This would lead to non-uniform performance of the TFTs across the active plate of the AMLCD. The finger 29 connects to the column electrode 25 the portion of the semiconductor island extending beyond it to the trailing edge 8 to address this problem. It will be appreciated that the finger fulfils the same function if the semiconductor island is printed in the opposite direction, although the location of the leading edge 6 of the island may be better defined.

In some circumstances, the provision of source electrodes either side of the drain electrode may afford additional benefits. For example, it effectively doubles the channel width, thus lowering the on resistance of the device.

The metallisation layer 23 is also used to form the top electrodes 31 of the storage capacitors 32, the gate dielectric 13 acting as the capacitor dielectric between the top electrodes 31 and the storage capacitor lines 7.

The metallisation layer 23 is then used as an etch mask to carry out a back-channel etching step to etch away the doped amorphous silicon layer 19 except under the metallisation layer. This leaves the intrinsic amorphous silicon layer 17 to form the channels 24 of thin film transistors. The regions 16 of the row electrodes 5 under the semiconductor island form the gates of the thin film transistors.

In this way the channel length of the thin film transistors is defined by the higher definition patterning method of photolithography instead of the lower definition method of printing. The arrangement of layers, and especially the simple form of the semiconductor island and row electrodes, means that inaccuracies in the definition of the semiconductor island and row electrodes is less critical than with conventional array structures.

A passivation layer 33 is then formed over the whole of the substrate (FIGS. 1(d)(i) and (ii). A contact hole mask 34 is then printed and used to etch vias 35 above the top electrode 31 of the capacitor and the drain 27. The passivation layer is of silicon nitride. Other materials may be used, such as polymer material. The contact hole mask is then removed, as is known.

Pixel electrodes 37 of indium tin oxide (ITO) are then printed over the passivation layer to complete the active plate (FIGS. 1(e)(i) and (ii)). The printing direction 38 is perpendicular to the row direction. The gap between the pixel electrode and adjacent electrodes is sufficient that trailing hairs 40 from the pixel electrodes do not overlap the adjacent row electrodes 5. FIG. 2 shows a top view of a portion of the finished active plate, showing the array of individual pixels.

A liquid crystal display may be formed from the active plate 41 made as above by providing a passive plate 43 and sandwiching liquid crystal 45 between the active and passive plates, in a manner known to those skilled in the art and as illustrated in FIG. 3.

The arrangement of the layers in the embodiment provides a TFT using only one high resolution patterning step. The remaining steps are carried out using lower resolution patterning steps. The only parameter that needs to be accurate is the channel length, and this is defined by the step of patterning the source and drain metallisation layer.

The method according to the invention is particularly suited for manufacturing AMLCDs with larger pixel sizes, such a liquid crystal TV with a screen size of diagonal greater than 20". For such larger displays, the pixel size is relatively large—for example for a 25" screen a VGA display has a pixel size of 265×795 $\mu$m. For large pixels, the required channel aspect ratio, expressed as width divided by length, is large as well. Thus, the width of the channel may be defined by the relatively coarse definition process of printing, and the length by a finer definition process. The length of the channel, the distance between source and drain, is defined by the step that defines the metallisation layer including the source and drain. For large pixel devices such as these, the required channel length is of order 5–10 $\mu$m.

The invention is not, however limited to such large screens. Indeed, the invention may be suitable for any device having thin-film transistors of a suitable size for printing. For example, the invention may be applied to smaller screens, or to other devices having an array of thin film transistors such as X-ray detectors of the type having an array of photodiodes and corresponding switching transistors.

In the embodiment the semiconductor regions are formed to be of simple rectangular form vertically aligned with part of the row conductors extending across the substrate with substantially uniform width. In contrast, in a conventional arrangement a spur extends laterally of the row conductor to form the gate and the semiconductor region is formed over the spur. The approach used in the embodiment reduces the required resolution of the patterning process of the semiconductor region. Any tails or hairs extending from the semiconductor regions will simply be over the row conductor, and not in the area of the TFTs, so lessening the risk of variable pixel capacitance, short circuits, or other undesired effects.

In a second embodiment of the method according to the invention, the method uses the same steps as described above except that microcontact printing replaces photolithography as the high resolution patterning step. Microcontact printing is described, inter alia, in a review article by Younan Xia and George M Whitesides entitled "Soft Lithography" published in Angewandte Chemie International Edition, 1998, volume 37, pages 550 to 575, which is incorporated herein by reference.

In order to pattern the metallisation layer by microcontact printing an elastomeric stamp with the required pattern is "inked" by "ink" molecules containing self-assembling molecules over a source/drain metallisation layer 23 over the whole substrate. The self assembling molecules form a structure that is used as an etch mask to etch away the source drain metallisation layer 23 and the upper semiconductor layer 19 as before. Suitable etchants for compatibility with microcontact printing are known to the skilled person; many are referred to in the review article mentioned above. The elastomeric stamp may be planar, a roller, or alternatively a roller may be used to transfer "ink" from a stamp to a substrate.

In a third embodiment of the method of manufacturing a plate, the method is identical to that described above except that the method of patterning the layers with a lower definition process is different. The method will be described with reference to FIGS. 4(a) to (c).

Instead of directly printing the first metallisation layer, the semiconductor islands and the pixel electrodes, these layers are patterned by depositing material 71 over the whole substrate 1 (FIG. 4(a)). Then, resist 73 is printed by gravure offset where the material 71 is required (FIG. 4(b)). An etchant etches away the material 71 where resist is absent, and then the resist is stripped, for example by immersing the device in a solvent for the resist (FIG. 4(c)).

In a modification of this embodiment, a different printing process may be used to deposit the resist.

Although the invention has been described with reference to specific embodiments, the skilled person will realise that a number of variations are possible. The invention is not only applicable to the field of AMLCDs, but also in other areas, especially where arrays of thin film devices are required such as in other large area electronic devices (LAEs). One example application where the approach of the invention may be suitable is in the manufacture of large image sensors, e.g. industrial X-ray detectors.

Further modifications may be made to the detail of the embodiment described. For example, the substrate may be opaque and the plate may reflect light. In this case, the pixel electrode need not be transparent.

In a further modification, some or all of the layers may be formed by covering the substrate with the material of the layer, printing a resist pattern onto the material and etching away the material where not required to pattern the layer. The use of printed resist avoids the need to process photoresist with photolithography techniques. In this way a lower cost printing technique may be used for patterning without needing to directly print the layer used.

The invention is not restricted to the manufacture of bottom-gated structures such as that described above, but is also applicable to the manufacture of top-gated structures. As the skilled person will appreciate, the order of the layers will determine the order of the manufacturing steps. For example, for a bottom gated structure the row electrodes forming the gate may be deposited and patterned followed by the gate insulation layer followed by the semiconductor regions and then the source and drain metallisations. Conversely, in order to form a top-gated structure the row electrodes defining the gate may be defined after the semiconductor layer, source and drain metallisations and gate insulator are deposited.

The described embodiment uses photolithography as the higher resolution process and printing as the lower resolution process. However, the invention is also applicable to other sets of processes. For example, the lower resolution process used for most of the layers may be a lower resolution photolithography process such as with a contact aligner, and the higher resolution process, a projection aligner may be used. Alternatively, a contact aligner may be used as the higher resolution process, with printing used as the lower resolution process.

Furthermore, it is not necessary to limit the number of processes to two. For example, it may be convenient to pattern one layer using one lower definition process and another layer using a different lower definition process. The invention may also be applied with a variety of semiconductor technologies. The amorphous silicon layer described may be replaced by any of a number of semiconductor types. Examples include polysilicon, organic semiconductors, II–VI semiconductors such as CdTe, III–V semiconductors such as GaAs, and others.

What is claimed is:

1. A method of manufacturing a plate having an army of thin film transistors including in any order the steps of:
    forming and patterning by a lower definition process a layer defining row conductors extending across a substrate;
    forming and patterning by a lower definition process semiconductor regions to form the channel regions of thin film transistors, the semiconductor regions being vertically aligned with regions of the row conductors which form the gates of the thin film transistors;
    forming a gate insulation layer between the layer defining row conductors and the semiconductor regions; and
    defining the sources and drains of the thin film transistors using a higher definition process.

2. A method according to claim 1 wherein the row conductors are of substantially uniform width in the region of the substrate in which the array of thin film transistors is formed.

3. A method according to claim 1 including patterning the semiconductor regions to be wholly over or under the row electrodes and to be of substantially rectangular form, with the long sides of the rectangle extending parallel to the row electrodes.

4. A method according to claim 1 wherein the higher definition process is photolithography.

5. A method according to claim 1 wherein the lower definition method is a printing method.

6. A method according to claim 5 wherein the row conductors are defined by printing in a row direction and the semiconductor regions are defined by printing in the same row direction.

7. A method according to claim 1 wherein the semiconductor region is a stack consisting of a lower layer of lower doped semiconductor and an upper layer of higher doped semiconductor, and the method includes the step of etching back the upper layer using the source and drain metallisation patterned by the higher definition process as a mask.

8. A method according to claim 1 further comprising the step of forming and patterning by a lower definition process a layer defining pixel electrodes to form an active plate of a liquid crystal display.

9. A method of manufacturing an active matrix LCD display including:

manufacturing an active plate using a method according to claim 8;

providing a passive plate; and sandwiching liquid crystal between the active and passive plates.

10. A method of manufacturing a plate having an array of thin film transistors, including depositing and patterning a plurality of layers to define the thin film transistors, wherein one of the plurality of layers is patterned using a higher definition process and others of the plurality of layers are patterned using a lower definition process.

11. A method according to claim 10 wherein one of the layers patterned with a lower definition process is a row electrode layer defining a plurality of row electrodes extending across the array of thin film transistors with substantially constant width, wherein the thin film transistors are formed vertically aligned with the row electrodes, and wherein a layer defining the source and drain of the thin film transistors is patterned with the higher definition process.

12. A method according to claim 8 further comprising the step of forming and patterning by a lower definition process a layer defining pixel electrodes to form an active plate of a liquid crystal display.

13. A method of manufacturing an active matrix LCD display including:

manufacturing an active plate using a method according to claim 12; providing a passive plate; and sandwiching liquid crystal between the active and passive plates.

14. A plate including an array of thin film transistors, comprising:

a substrate;

row conductors extending across the substrate with substantially uniform width;

a gate insulator over the row conductors;

semiconductor regions of substantially rectangular form, aligned along and over parts of the row conductors the semiconductor regions forming the channels of thin film transistors and the row conductor under the semiconductor regions forming the gates of the thin film transistors; and a metallisation layer defining the source and drain of the thin film transistors.

15. A plate according to claim 14 wherein the row conductors and the semiconductor regions are defined by a printing method.

16. A plate according to claim 14 further comprising pixel electrodes connected to one of the source and drain of the thin film transistors.

17. An active matrix liquid crystal display comprising a plate according to claim 16, a passive plate and liquid crystal sandwiched between the active and passive plates.

* * * * *